United States Patent
Liu et al.

(10) Patent No.: US 11,177,065 B2
(45) Date of Patent: Nov. 16, 2021

(54) THERMAL PATHS FOR GLASS SUBSTRATES

(71) Applicant: QUALCOMM Incorporated, San Diego, CA (US)

(72) Inventors: Kai Liu, San Diego, CA (US); Xiaoju Yu, San Diego, CA (US); Xia Li, San Diego, CA (US); Bin Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/835,227

(22) Filed: Mar. 30, 2020

(65) Prior Publication Data

US 2021/0304944 A1 Sep. 30, 2021

(51) Int. Cl.
*H01L 23/498* (2006.01)
*H01F 27/22* (2006.01)
(Continued)

(52) U.S. Cl.
CPC .............. *H01F 27/22* (2013.01); *H01F 27/29* (2013.01); *H01G 4/252* (2013.01); *H01G 4/33* (2013.01);
(Continued)

(58) Field of Classification Search
CPC .......... H01F 27/22; H01F 27/29; H01G 4/252; H01G 4/33; H01G 4/306; H01L 21/4853; H01L 23/49838; H01L 24/17; H01L 23/3142; H01L 23/49811; H01L 23/49816; H01L 24/81; H01L 25/0655; H01L 25/0652; H01L 25/04; H01L 25/50
See application file for complete search history.

(56) References Cited

U.S. PATENT DOCUMENTS 8,941,212 B2 * 1/2015 Yen ...................... H01L 25/0657
257/528
9,247,647 B1 1/2016 Yoon et al.
(Continued)

FOREIGN PATENT DOCUMENTS

EP 2814053 A1 12/2014

OTHER PUBLICATIONS

Zhao et al. Ultra-high thermally conductive and raid heat responsive poly(benzobisoxazole) nanocomposites with self-aligned graphene, Oct. 5, 2016 (Year: 2016).*
(Continued)

*Primary Examiner* — Steven T Sawyer
(74) *Attorney, Agent, or Firm* — Muncy, Geissler, Olds & Lowe, P.C.

(57) ABSTRACT

Examples herein include thermally conductive pathways for glass substrates such as used by passive on glass devices that may be used to enhance the thermal conductivity of an integrated POG device. By using a thermally conductive material for passivation of the device pathways during manufacturing, the device pathways may be able to conduct heat away from the device. For example, by using a selected poly (p-phenylene benzobisoxazole) (PBO) based material (e.g., poly-p-phenylene-2, 6-benzobisoxazole) instead of conventional polyimide (PI) materials during a Cu pattern passivation process, the overall thermal performance of the device, may be enhanced.

24 Claims, 6 Drawing Sheets

(51) Int. Cl.
*H01G 4/33* (2006.01)
*H01F 27/29* (2006.01)
*H01G 4/252* (2006.01)

(52) U.S. Cl.
CPC .. *H01L 23/49811* (2013.01); *H01L 23/49816* (2013.01); *H01L 23/49838* (2013.01)

(56) References Cited

U.S. PATENT DOCUMENTS

| | | | |
|---|---|---|---|
| 2008/0153245 A1* | 6/2008 | Lin | H01L 23/5223 438/381 |
| 2008/0210946 A1* | 9/2008 | Okada | H01L 27/14676 257/71 |
| 2009/0230542 A1* | 9/2009 | Lin | H01L 28/40 257/700 |
| 2011/0198748 A1* | 8/2011 | Koike | H01L 23/53238 257/737 |
| 2013/0134582 A1* | 5/2013 | Yu | H01L 23/49816 257/737 |
| 2013/0147033 A1* | 6/2013 | Chen | H01L 23/3192 257/737 |
| 2014/0061897 A1* | 3/2014 | Lin | H01L 24/14 257/737 |
| 2014/0145326 A1* | 5/2014 | Lin | H01L 23/525 257/737 |
| 2014/0167269 A1* | 6/2014 | Lu | H01L 25/0655 257/762 |
| 2014/0203397 A1* | 7/2014 | Yen | H01L 25/0657 257/531 |
| 2014/0211438 A1* | 7/2014 | Lin | H01L 21/563 361/767 |
| 2016/0133686 A1* | 5/2016 | Liao | H01L 28/60 257/532 |
| 2017/0077079 A1* | 3/2017 | Lan | H01L 28/75 |
| 2017/0133336 A1* | 5/2017 | Oliver | H01L 21/02063 |
| 2017/0373044 A1* | 12/2017 | Das | H01L 23/5226 |
| 2018/0077803 A1* | 3/2018 | Yun | H05K 3/4688 |

OTHER PUBLICATIONS

Yasuko et al. Thermal Conductivity of poly-p-phenylene-2, 6-benzobisoxazole Film along the In-Plane Axis in the 10-300 K Temperature Range, Sep. 28, 2018 (Year: 2018).*

Anonymous: "PBO", Jul. 5, 2021 (Jul. 5, 2021), pp. 1-2, XP055821076, Retrieved from the Internet: URL: https://polymerdatabase.com/Polymer%20Brands/PBO.html [retrieved on Jul. 5, 2021] Section "Properties and Applications".

International Search Report and Written Opinion—PCT/US2021/024597—ISA/EPO—dated Jul. 15, 2021.

Yamanaka A., et al., "Thermal Conductivity of poly-p-phenylene-2, 6-benzobisoxazole Film Along the In-Plane Axis in the 10-300 K Temperature Range", Journal of Macromolecular Science Part B. Physics, [Online] vol. 57, No. 9, Sep. 2, 2018 (Sep. 2, 2018), pp. 595-607, XP055821090, US ISSN: 0022-2348, DOI: 10.1080/00222348.2018.1493832, Retrieved from the Internet: URL:https://www.tandfonline.com/doi/pdf/10.1080/00222348.2018.1493832?needAccess=true [retrieved on Jul. 5, 2021] abstract.

Yasuko, et al., "The Thermal Conductivities of the PBO Films Increased from 0.3 W/mK to 9.0 W/mK with Increasing Temperature from 10 K to 300 K,", 2018.

* cited by examiner

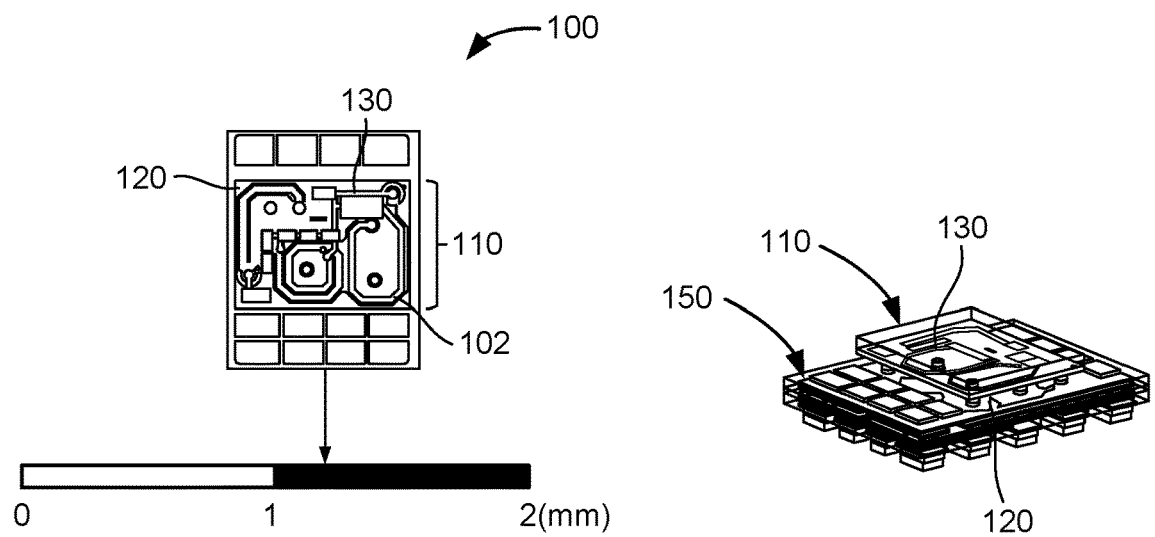
FIG. 1A
FIG. 1B
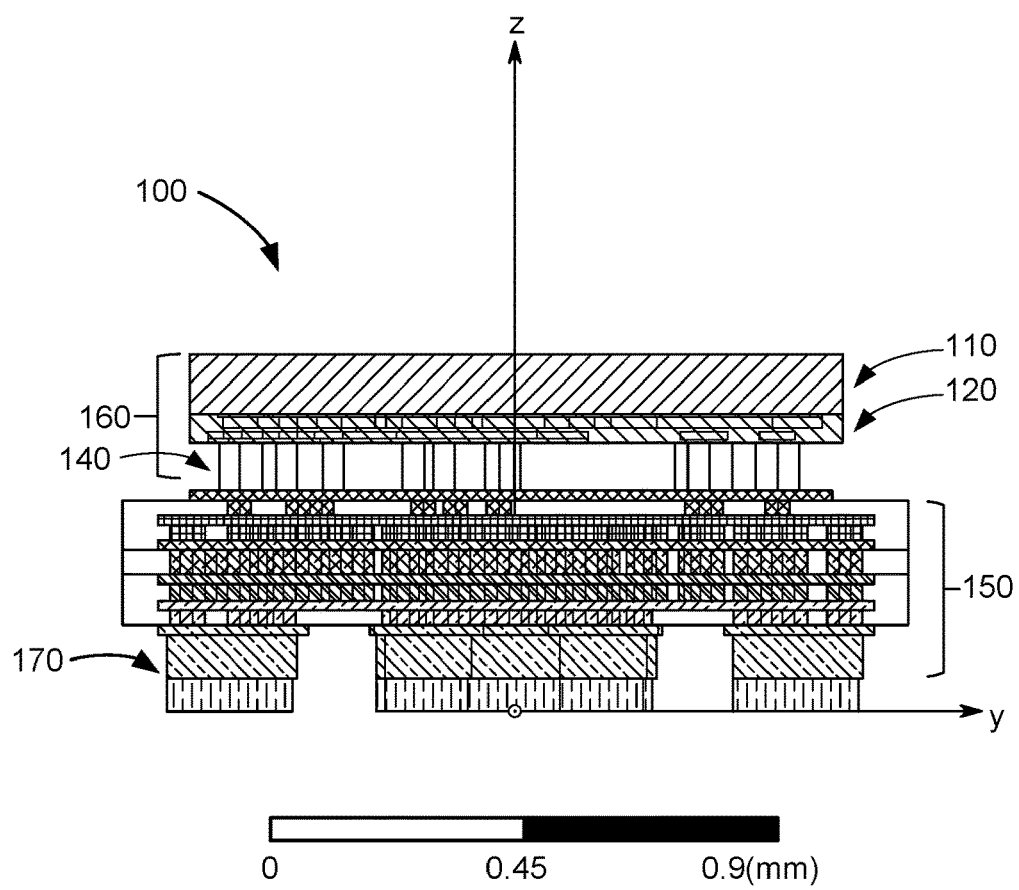
FIG. 1C

THERMAL PATHS FOR GLASS SUBSTRATES

FIELD OF DISCLOSURE

This disclosure relates generally to glass substrates, and more specifically, but not exclusively, to thermally conductive paths for use with glass substrates.

BACKGROUND

An integrated circuit (IC) is an electronic device that has many circuits, which include active and passive components. In a typical IC, the components are manufactured in and on a substrate material. During operation, electronic devices generate heat. Heat generated during operation needs to be dissipated to prevent damage to the electronic device. Mechanisms used to dissipate heat in an electronic device should not interfere with the operation of the electronic device.

In addition, mobile radio frequency (RF) chips (e.g., mobile RF transceivers) have increased in design complexity by adding circuit functions for supporting communications enhancements, such as fifth generation (5G) technologies. Designing these mobile RF transceivers includes using passive devices, for example, for suppressing resonance, and/or for performing filtering, bypassing, and coupling. The increased circuit complexity also increases the amount of noise etc. Thus, RF chips designs have moved towards the use of passive-on-glass (POG) technology since POG uses glass wafers for good RF performance.

However, POG substrates are also a thermal insulator. For high-power applications, e.g. transmitting paths in 5G modules, POG substrates suffer high-temperatures, which result in long-term reliability issues for conventional approaches. Furthermore, conventional attempts to create a high thermally conductive glass (high as for Silicon) have not been successful.

Accordingly, there is a need for systems, apparatus, and methods that overcome the deficiencies of conventional approaches including the methods, system and apparatus provided hereby.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In one aspect, an integrated passive device comprises: a glass substrate; a first device on a first side of the glass substrate; a metallization structure on the first side of the glass substrate coupled to the first device; and a passivation layer on the first side of the glass substrate, wherein the passivation layer comprises a thermally conductive material of greater than 3 Watts per meter-Kelvin (W/mK).

In another aspect, an integrated passive device comprises: a glass substrate; a first device on a first side of the glass substrate; means for routing a signal on the first side of the glass substrate coupled to the first device; and means for passivation on the first side of the glass substrate, wherein the means for passivation comprises a thermally conductive material of greater than 3 Watts per meter-Kelvin (W/mK).

In still another aspect, a method for manufacturing an integrated passive device may comprise: providing a glass substrate; mounting a first device on a first side of the glass substrate; forming a metallization structure on the first side of the glass substrate; coupling the metallization structure to the first device; and forming a passivation layer on the first side of the glass substrate, wherein the passivation layer comprises a thermally conductive material of greater than 3 Watts per meter-Kelvin (W/mK).

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which:

FIGS. 1A-C illustrate an exemplary integrated passive device in accordance with some examples of the disclosure;

Figure 2A:
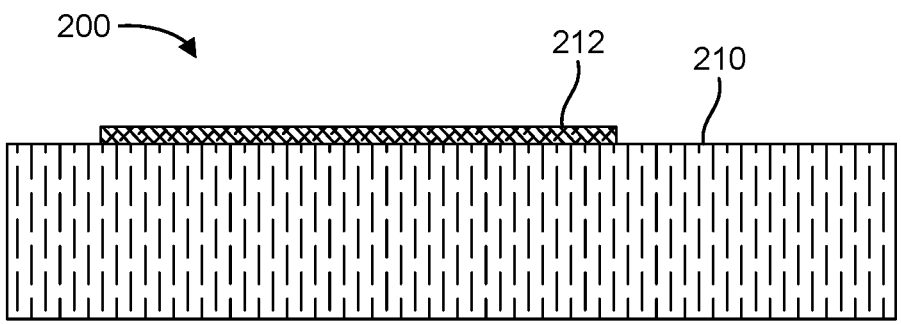
FIGS. 2A-G illustrates an exemplary partial method for manufacturing an integrated passive device in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein mitigate shortcomings of the conventional methods, apparatus, and systems, as well as other previously unidentified needs. In some examples, thermally conductive pathways for glass substrates such as used by passive on glass device may be used to enhance the thermal conductivity of an integrated POG device. By using a thermally conductive material for passivation of the device pathways during manufacturing, the device pathways may be able to conduct heat away from the device. For example, by using a selected poly (p-phenylene benzobisoxazole) (PBO) based material (e.g., poly-p-phenylene-2, 6-benzobisoxazole) instead of conventional polyimide (PI) materials during a Cu pattern passivation process, the overall thermal performance of the device, may be enhanced.

FIGS. 1A-C illustrate an exemplary integrated passive device in accordance with some examples of the disclosure. As shown in FIG. 1A, an integrated passive device 100 may include a glass substrate 110, a first device 102 on a first side of the glass substrate 110, a metallization structure 130 on the first side of the glass substrate 110 coupled to the first device 102, and a passivation layer 120 on the first side of the glass substrate 110. In some examples, the passivation layer 120 comprises a thermally conductive material of greater than 3 Watts per meter-Kelvin (W/mK).

In conventional POG devices, a passivation layer of a photo-definable polymer such as a polyimide (PI) is used in conjunction for the metallization structure as a dielectric. However, conventional PIs have a 0.12 W/mK, which leads to high temperatures on the glass and subsequent reliability issues. The PI thermal conductivity is small (0.12 W/mK) and since POG devices use glass substrates for Radio Frequency (RF) performance that are thermal insulator with small thermal conductivity (1.31 W/mK) as well, the heat related reliability issues. By using a thermally conductive material of greater than 3 W/mK, the temperatures on the glass may be reduced to avoid heat damage and heat related reliability and performance issues.

In some examples herein, a photo-definable polybenzoxazoles (PBO) may be used as the polymer for the passivation layer 120 instead of a PI. For example, the thermally conductive material may be a non-polymide including, but not limited to, a p-phenylene benzobisoxazole based material, a thermally conductive material of greater than 9 Watts per meter-Kelvin (W/mK). Improving the thermal conductivity of the passivation layer for metal traces can reduce peak temperature considerably (e.g., 18% if using 3.0 W/mK versus 0.12 W/mK for passivation material) and using PBO materials could further reduce the peak temperature, such as a poly-p-phenylene-2, 6-benzobisoxazole based thin film or a Nano composite film with an ultra-high thermal diffusivity (e.g., 900-1000 mm2 s−1) and a high thermal conductivity (e.g., 50 W m−1 K−1).

As shown in FIG. 1B, the integrated passive device 100 may also include a package substrate 150 below the glass substrate 110 and the passivation layer 120 that may be coupled to the metallization structure 130. As shown in FIG. 1C, the integrated passive device 100 may also include a POG device 160 comprising the glass substrate 110 and the passivation layer 120 that may be coupled to the package substrate 150 through a plurality of connections 140 and further to a plurality of package connections 170. In addition, the metallization structure 130 and plurality of connections 140 may be configured to conduct heat away from the first device 102. While a first device 102 is shown, it should be understood that the first device may be more than one and each may be a passive device, such as an inductor, capacitor, or similar. Furthermore, it should be understood that the integrated passive device 100 may be incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

Figure 2B:
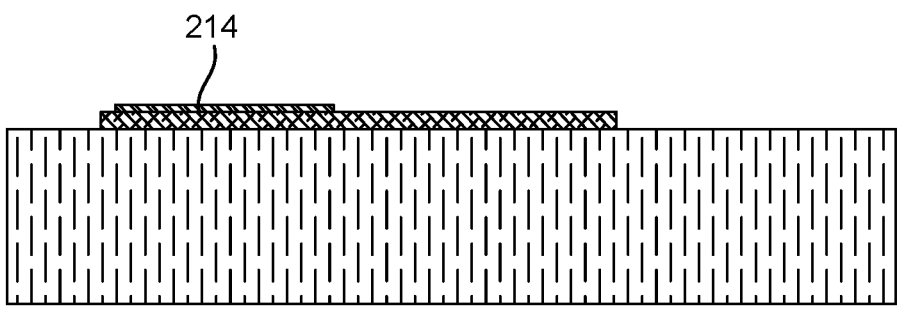
Figure 2C:
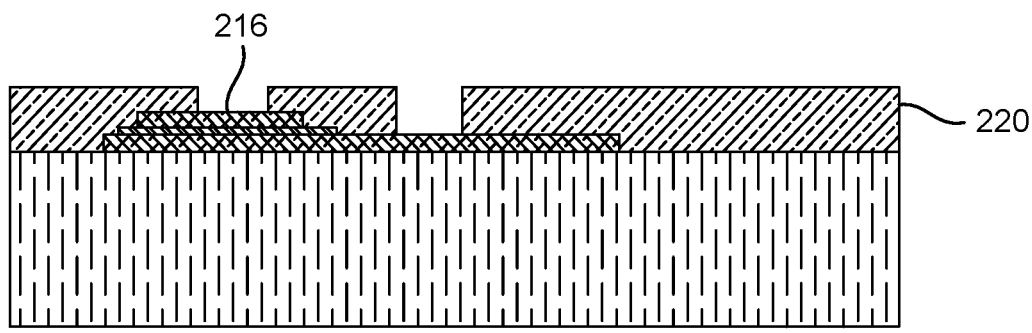
Figure 2D:
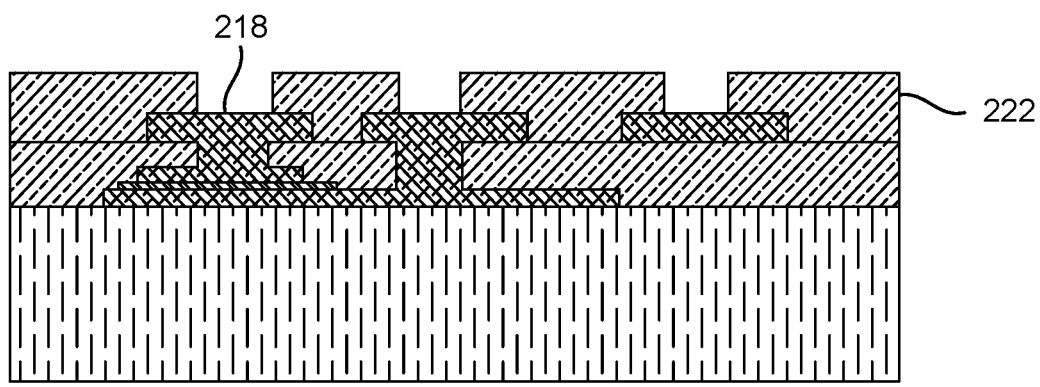

FIGS. 2A-G illustrates an exemplary partial method for manufacturing an integrated passive device (e.g., integrated passive device 100) in accordance with some examples of the disclosure. As shown in FIG. 2A, a partial method 200 may begin with providing or forming a glass substrate 210 forming or plating a first metal layer 212, such as copper or similarly conductive metal. As shown in FIG. 2B, the partial method 200 may continue with forming or depositing a silicon nitride (SiN) layer 214, such as by chemical vapor deposition. As shown in FIG. 2C, the partial method 200 may continue with forming or plating a second metal layer 216, such as copper or similarly conductive metal, and forming or coating a first passivation layer 220. As shown in FIG. 2D, the partial method 200 may continue with forming or plating a third metal layer 218, such as copper or similarly conductive metal, and forming or coating a second passivation layer 222.

Figure 2E:
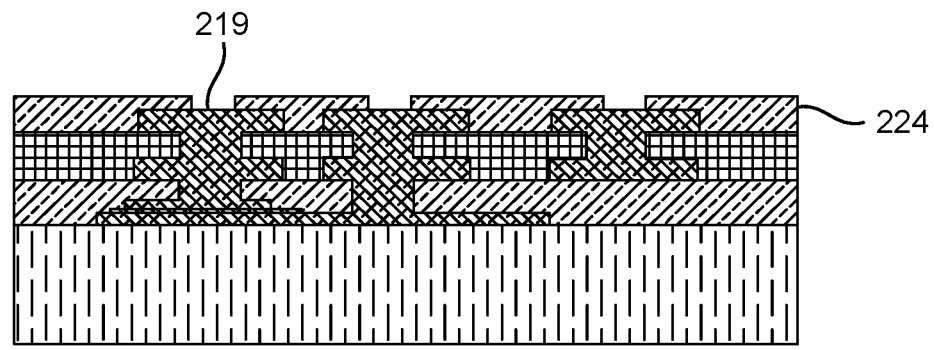
Figure 2F:
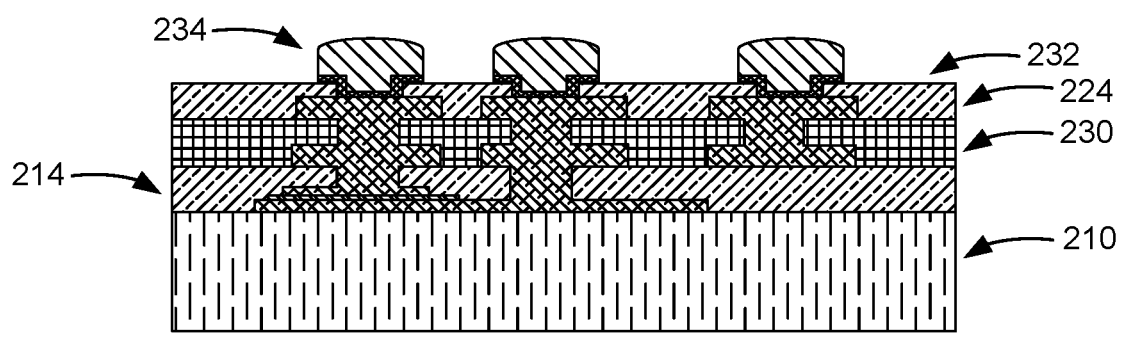
Figure 2G:
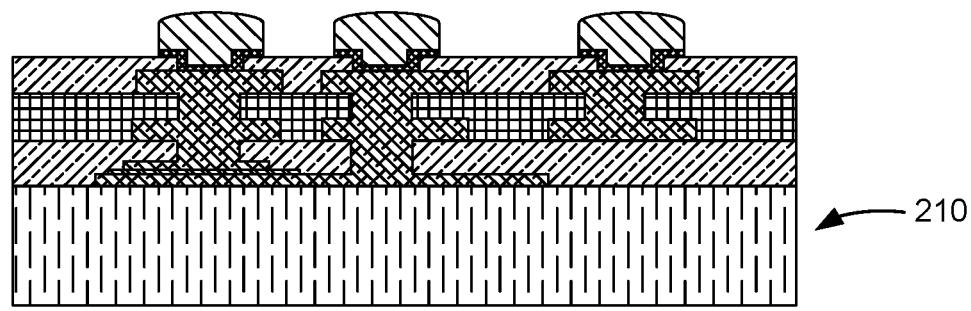

As shown in FIG. 2E, the partial method 200 may continue with forming or plating a fourth metal layer 219, such as copper or similarly conductive metal, and forming or coating a third passivation layer 224. As a result, one or more passive devices 230 may be formed. As shown in FIG. 2F, the partial method 200 may continue with forming or plating an under bump metal 232 and forming or depositing solder balls 234. As shown in FIG. 2G, the partial method 200 may continue with thinning or shaping the glass substrate 210. It should be understood that the first passivation layer 220, the second passivation layer 222, and the third passivation layer 224 may comprise a single structure or layer such as passivation layer 120 shown in FIG. 1. It should also be understood that the first metal layer 212, the second metal layer 216, the third metal layer 218, and the fourth metal layer 219 may comprise a metallization structure such as metallization structure 130. It should further be understood that one or more passive devices 230 may comprise a first device such as first device 110.

Figure 3:
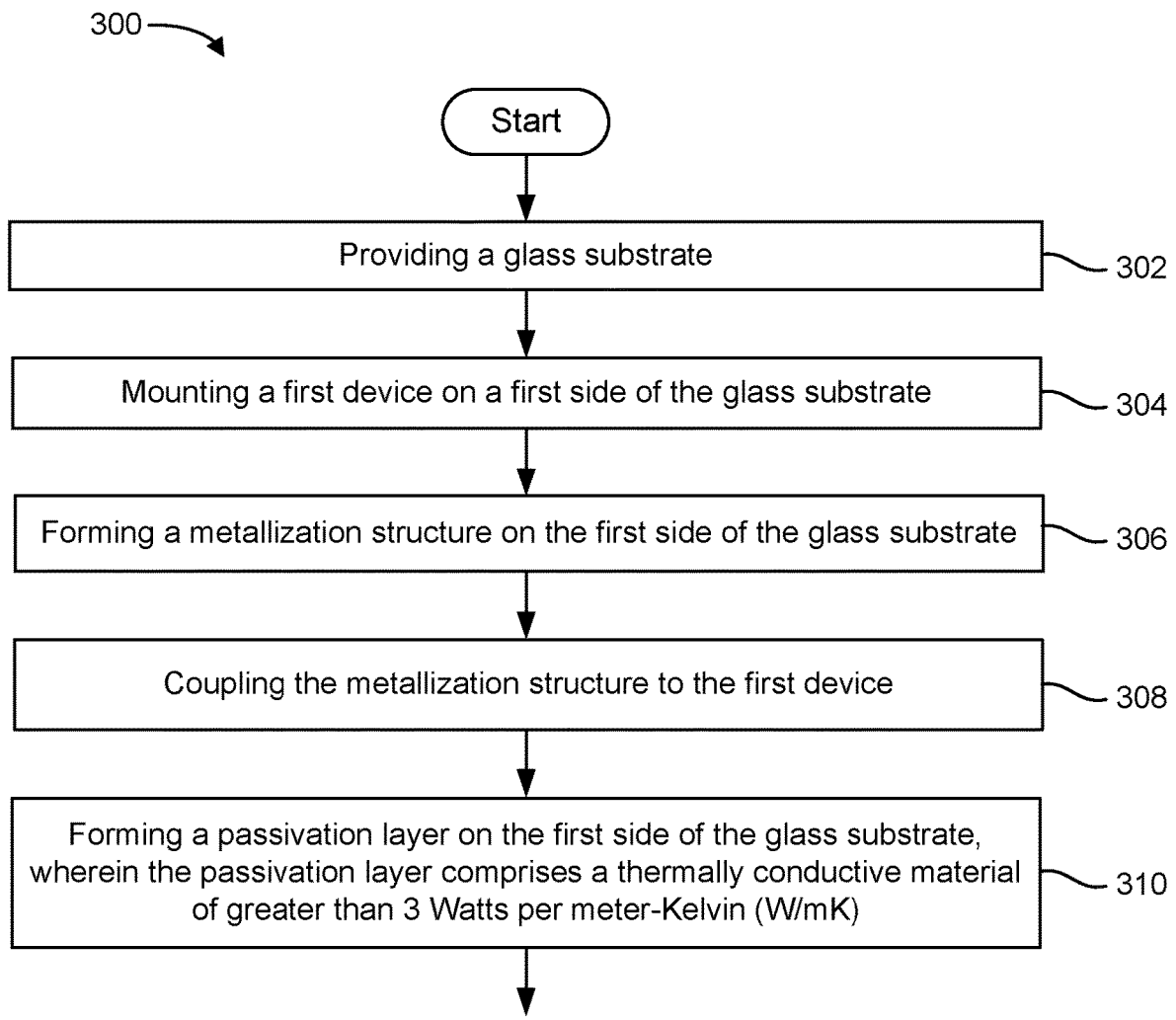
FIG. 3 illustrates another exemplary partial method in accordance with some examples of the disclosure.

FIG. 3 illustrates an exemplary partial method for manufacturing an integrated passive device in accordance with some examples of the disclosure. As shown in FIG. 3, the partial method 300 may begin in block 302 with providing a glass substrate. The partial method 300 may continue in block 304 with mounting a first device on a first side of the glass substrate. The partial method 300 may continue in block 306 with forming a metallization structure on the first side of the glass substrate. The partial method 300 may continue in block 308 with coupling the metallization structure to the first device. The partial method 300 may conclude in block 310 with forming a passivation layer on the first side of the glass substrate, wherein the passivation layer comprises a thermally conductive material of greater than 3 Watts per meter-Kelvin (W/mK).

Alternatively, the partial method 300 may include wherein the thermally conductive material is a non-polymide, a p-phenylene benzobisoxazole based material or a p-phenylene benzobisoxazole based material; wherein the first device is a passive device; coupling a plurality of connections to the metallization structure opposite the glass substrate; coupling a package substrate to the metallization structure opposite the glass substrate; coupling a plurality of connections coupled to the metallization structure opposite the glass substrate and coupling a package substrate to the plurality of connections opposite the metallization structure, wherein the metallization structure and plurality of connections are configured to conduct heat away from the first device; and/or incorporating the integrated passive device into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

Figure 4:
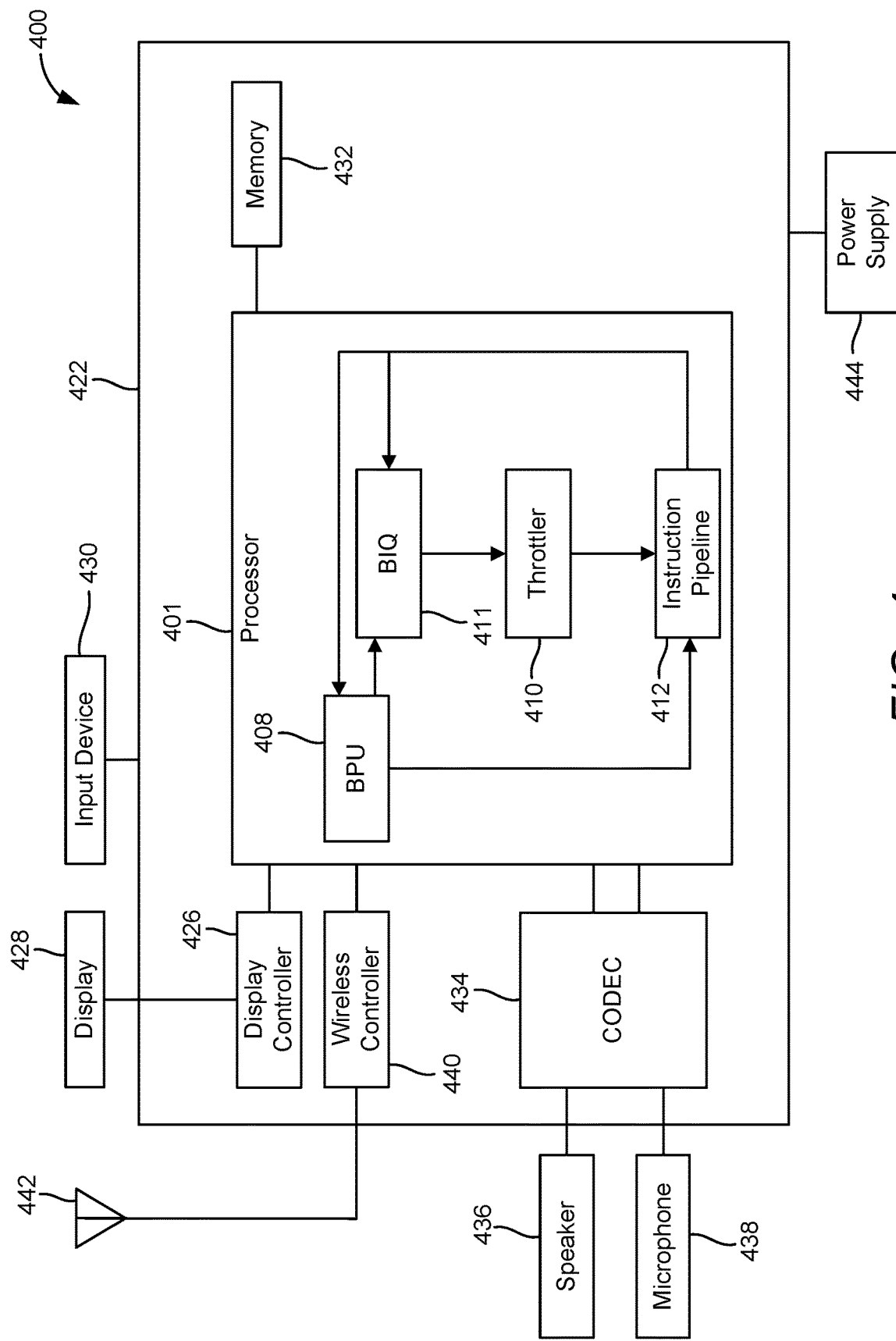
FIG. 4 illustrates an exemplary mobile device in accordance with some examples of the disclosure.

FIG. 4 illustrates an exemplary mobile device in accordance with some examples of the disclosure. Referring now to FIG. 4, a block diagram of a mobile device that is configured according to exemplary aspects is depicted and generally designated 400. In some aspects, mobile device 400 may be configured as a wireless communication device. As shown, mobile device 400 includes processor 401, which may be configured to implement the methods described herein in some aspects. Processor 401 is shown to comprise instruction pipeline 412, buffer processing unit (BPU) 408, branch instruction queue (BIQ) 411, and throttler 410 as is well known in the art. Other well-known details (e.g., counters, entries, confidence fields, weighted sum, comparator, etc.) of these blocks have been omitted from this view of processor 401 for the sake of clarity.

Processor 401 may be communicatively coupled to memory 432 over a link, which may be a die-to-die or chip-to-chip link. Mobile device 400 also include display 428 and display controller 426, with display controller 426 coupled to processor 401 and to display 428.

In some aspects, FIG. 4 may include coder/decoder (CODEC) 434 (e.g., an audio and/or voice CODEC) coupled to processor 401; speaker 436 and microphone 438 coupled to CODEC 434; and wireless controller 440 (which may include a modem) coupled to wireless antenna 442 and to processor 401.

In a particular aspect, where one or more of the above-mentioned blocks are present, processor 401, display controller 426, memory 432, CODEC 434, and wireless controller 440 can be included in a system-in-package or system-on-chip device 422. Input device 430 (e.g., physical or virtual keyboard), power supply 444 (e.g., battery), display 428, input device 430, speaker 436, microphone 438, wireless antenna 442, and power supply 444 may be external to system-on-chip device 422 and may be coupled to a component of system-on-chip device 422, such as an interface or a controller.

It should be noted that although FIG. 4 depicts a mobile device, processor 401 and memory 432 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 5:
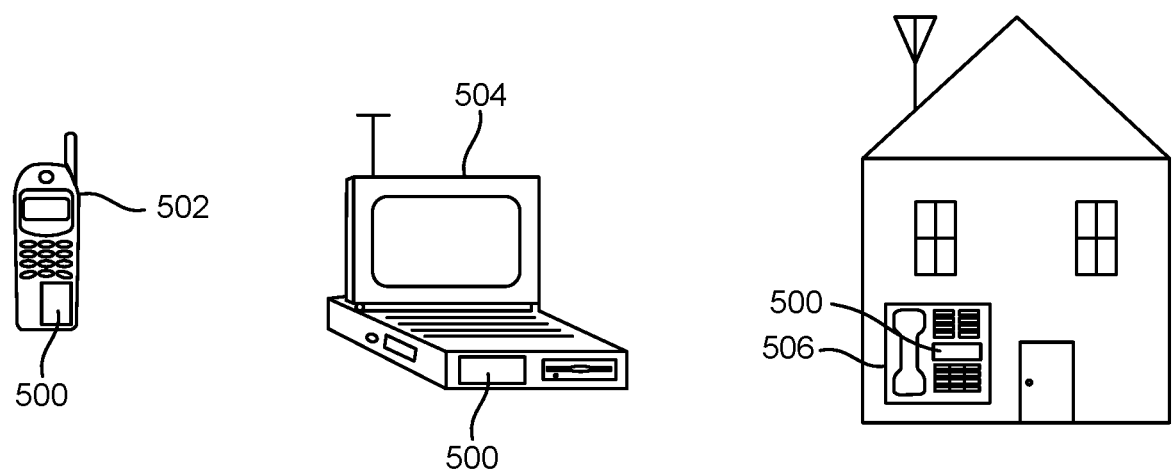
FIG. 5 illustrates various electronic devices that may be integrated with any of the aforementioned methods, devices, semiconductor devices, integrated circuits, die, interposers, packages, or package-on-packages (PoPs) in accordance with some examples of the disclosure.

FIG. 5 illustrates various electronic devices that may be integrated with any of the aforementioned integrated passive device, semiconductor device, integrated circuit, die, interposer, package or package-on-package (PoP) in accordance with some examples of the disclosure. For example, a mobile phone device 502, a laptop computer device 504, and a fixed location terminal device 506 may include an integrated passive device 500 as described herein. The integrated passive device 500 may be, for example, any of the integrated circuits, dies, integrated passive devices, integrated passive device packages, integrated circuit devices, device packages, integrated circuit (IC) packages, package-on-package devices described herein. The devices 502, 504, 506 illustrated in FIG. 5 are merely exemplary. Other electronic devices may also feature the integrated passive device 500 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

It will be appreciated that various aspects disclosed herein can be described as functional equivalents to the structures, materials and/or devices described and/or recognized by those skilled in the art. It should furthermore be noted that methods, systems, and apparatus disclosed in the description or in the claims can be implemented by a device comprising means for performing the respective actions of this method. For example, in one aspect, an integrated passive device (e.g., integrated passive device 100) may comprises: a glass substrate; a first device on a first side of the glass substrate; means for routing a signal (e.g., a metallization structure) on the first side of the glass substrate coupled to the first device; means for passivation (e.g., passivation layer) on the first side of the glass substrate, wherein the means for passivation comprises a thermally conductive material of greater than 3 Watts per meter-Kelvin (W/mK). It will be appreciated that the aforementioned aspects are merely provided as examples and the various aspects claimed are not limited to the specific references and/or illustrations cited as examples.

One or more of the components, processes, features, and/or functions illustrated in FIGS. 1-5 may be rearranged and/or combined into a single component, process, feature or function or incorporated in several components, processes, or functions. Additional elements, components, processes, and/or functions may also be added without departing from the disclosure. It should also be noted that FIGS. 1-5 and its corresponding description in the present disclosure is not limited to dies and/or ICs. In some implementations, FIGS. 1-5 and its corresponding description may be used to manufacture, create, provide, and/or produce integrated devices. In some implementations, a device may include a die, an integrated passive device, a die package, an integrated circuit (IC), a device package, an integrated circuit (IC) package, a wafer, a semiconductor device, a package on package (PoP) device, and/or an interposer. An active side of a device, such as a die, is the part of the device that contains the active components of the device (e.g. transistors, resistors, capacitors, inductors etc.), which perform the operation or function of the device. The backside of a device is the side of the device opposite the active side. As used herein, a metallization structure may include metal layers, vias, pads, or traces with dielectric between, such as a redistribution layer or RDL).

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5 (both expressly incorporated herein in their entirety).

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples and is not intended to be limiting of examples of the disclosure. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, actions, operations, elements, and/or components, but do not preclude the presence or addition of one or more other features, integers, actions, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer or an electronic circuit. In some examples, some or a plurality of the most important method actions can be performed by such an apparatus.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. An integrated passive device comprising:
   a glass substrate;
   a first device on a first side of the glass substrate;
   a metallization structure directly on the first side of the glass substrate thermally coupled to the first device;
   a passivation layer on the first side of the glass substrate, wherein the passivation layer comprises a plurality of layers of different materials and each of the different materials comprises a thermally conductive material of greater than 3 Watts per meter-Kelvin (W/mK);
   one or more solder balls thermally coupled to the metallization structure, the metallization structure being in between the glass substrate and the one or more solder balls;
   a plurality of connections thermally coupled to the metallization structure through the one or more solder balls, the one or more solder balls being in between the metallization structure and the plurality of connections;
   a package substrate thermally coupled to the plurality of connections on a first side of the package substrate; and
   a plurality of package connections on a second side of the package substrate opposite the first side of the package substrate,
   wherein the passivation layer is thermally coupled to the package substrate through the plurality of connections and thermally coupled to the plurality of package connections.

2. The integrated passive device of claim 1, wherein the thermally conductive material is a non-polymide.

3. The integrated passive device of claim 1, wherein the thermally conductive material is a p-phenylene benzobisoxazole based material.

4. The integrated passive device of claim 1, wherein the thermally conductive material is a thermally conductive material of greater than 9 Watts per meter-Kelvin (W/mK).

5. The integrated passive device of claim 1, wherein the first device is a passive device.

6. The integrated passive device of claim 1, wherein the package substrate is thermally coupled to the metallization structure on a side of the metallization structure opposite the glass substrate.

7. The integrated passive device of claim 1, wherein the package substrate is thermally coupled to the plurality of connections on a side of the plurality of connections opposite the metallization structure, and wherein the metallization structure and plurality of connections are configured to conduct heat away from the first device.

8. The integrated passive device of claim 1, wherein the integrated passive device is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

9. An integrated passive device comprising:
   a glass substrate;
   a first device on a first side of the glass substrate;
   means for routing a signal directly on the first side of the glass substrate thermally coupled to the first device;
   means for passivation on the first side of the glass substrate, wherein the means for passivation comprises a plurality of layers of different materials and each of the different materials comprises a thermally conductive material of greater than 3 Watts per meter-Kelvin (W/mK);
   one or more solder balls thermally coupled to the means for a routing a signal, the means for routing a signal being in between the glass substrate and the one or more solder balls;
   a plurality of connections thermally coupled to means for a routing a signal through the one or more solder balls, the one or more solder balls being in between the means for a routing a signal and the plurality of connections;
   a package substrate thermally coupled to the plurality of connections on a first side of the package substrate; and
   a plurality of package connections on a second side of the package substrate opposite the first side of the package substrate,
   wherein the means for passivation is thermally coupled to the package substrate through the plurality of connections and thermally coupled to the plurality of package connections.

10. The integrated passive device of claim 9, wherein the thermally conductive material is a non-polymide.

11. The integrated passive device of claim 9, wherein the thermally conductive material is a p-phenylene benzobisoxazole based material.

12. The integrated passive device of claim 9, wherein the thermally conductive material is a thermally conductive material of greater than 9 Watts per meter-Kelvin (W/mK).

13. The integrated passive device of claim 9, wherein the first device is a passive device.

14. The integrated passive device of claim 9,
    wherein the package substrate is thermally coupled to the means for routing a signal on a side of the means for routing a signal opposite the glass substrate.

15. The integrated passive device of claim 9,
    wherein the package substrate is thermally coupled to the plurality of connections on a side of the plurality of connections opposite the means for routing a signal, and wherein the means for routing a signal and plurality of connections are configured to conduct heat away from the first device.

16. The integrated passive device of claim 9, wherein the integrated passive device is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

17. A method for manufacturing an integrated passive device, the method comprising:
providing a glass substrate;
mounting a first device on a first side of the glass substrate;
forming a metallization structure directly on the first side of the glass substrate;
coupling the metallization structure to the first device;
forming a passivation layer on the first side of the glass substrate, wherein the passivation layer comprises a plurality of layers of different materials and each of the different materials comprises a thermally conductive material of greater than 3 Watts per meter-Kelvin (W/mK);
forming one or more solder balls thermally coupled to the metallization structure, the metallization structure being in between the glass substrate and the one or more solder balls;
forming a plurality of connections thermally coupled to the metallization structure through the one or more solder balls, the one or more solder balls being in between the metallization structure and the plurality of connections;
forming a package substrate thermally coupled to the plurality of connections on a first side of the package substrate; and
forming a plurality of package connections on a second side of the package substrate opposite the first side of the package substrate,
wherein the passivation layer is thermally coupled to the package substrate through the plurality of connections and thermally coupled to the plurality of package connections.

18. The method of claim 17, wherein the thermally conductive material is a non-polymide.

19. The method of claim 17, wherein the thermally conductive material is a p-phenylene benzobisoxazole based material.

20. The method of claim 17, wherein the thermally conductive material is a thermally conductive material of greater than 9 Watts per meter-Kelvin (W/mK).

21. The method of claim 17, wherein the first device is a passive device.

22. The method of claim 17,
wherein the package substrate is thermally coupled to the metallization structure on a side of the metallization structure opposite the glass substrate.

23. The method of claim 17,
wherein the package substrate is thermally coupled to the plurality of connections on a side of the plurality of connections opposite the metallization structure, and
wherein the metallization structure and plurality of connections are configured to conduct heat away from the first device.

24. The method of claim 17, further comprising incorporating the integrated passive device into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

* * * * *